(12) United States Patent
Inokuchi et al.

(10) Patent No.: US 9,230,625 B2
(45) Date of Patent: Jan. 5, 2016

(54) MAGNETIC MEMORY, SPIN ELEMENT, AND SPIN MOS TRANSISTOR

(71) Applicant: KABUSHIKI KAISHA TOSHIBA, Minato-ku (JP)

(72) Inventors: Tomoaki Inokuchi, Yokohama (JP); Mizue Ishikawa, Yokohama (JP); Hideyuki Sugiyama, Kawasaki (JP); Tetsufumi Tanamoto, Kawasaki (JP); Akira Takashima, Tokyo (JP); Yoshiaki Saito, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/204,422

(22) Filed: Mar. 11, 2014

(65) Prior Publication Data

US 2014/0301136 A1    Oct. 9, 2014

(30) Foreign Application Priority Data

Apr. 3, 2013   (JP) .................................. 2013-078005

(51) Int. Cl.
| | |
|---|---|
| *G11C 11/16* | (2006.01) |
| *G11C 5/12* | (2006.01) |
| *H01L 29/82* | (2006.01) |
| *H01L 29/66* | (2006.01) |
| *H01L 43/08* | (2006.01) |
| *G11C 13/00* | (2006.01) |
| *H01L 27/22* | (2006.01) |

(52) U.S. Cl.
CPC .......... *G11C 11/161* (2013.01); *G11C 11/1673* (2013.01); *G11C 11/1675* (2013.01); *H01L 27/224* (2013.01); *H01L 29/66984* (2013.01); *H01L 29/82* (2013.01); *H01L 43/08* (2013.01); *G11C 11/16* (2013.01); *G11C 13/0069* (2013.01); *H01L 27/222* (2013.01)

(58) Field of Classification Search
CPC .. G11C 11/1675; G11C 11/161; G11C 11/16; G11C 13/0069; H01L 27/222
USPC .................................... 365/158, 171, 173, 66
See application file for complete search history.

(56) References Cited

U.S. PATENT DOCUMENTS

| | | | | |
|---|---|---|---|---|
| 5,640,343 | A | * | 6/1997 | Gallagher et al. ............. 365/171 |
| 6,480,412 | B1 | * | 11/2002 | Bessho et al. .................. 365/173 |
| 2003/0151944 | A1 | * | 8/2003 | Saito .............................. 365/173 |

(Continued)

FOREIGN PATENT DOCUMENTS

JP          2003197920 A   *   7/2003

OTHER PUBLICATIONS

T. Maruyama, et al., "Large voltage-induced magnetic anisotropy change in a few atomic layers of iron", Nature Nanotechnology, vol. 4, Mar. 2009, 4 pages.

*Primary Examiner* — Ly D Pham
(74) *Attorney, Agent, or Firm* — Oblon, McClelland, Maier & Neustadt, L.L.P.

(57) ABSTRACT

A magnetic memory according to an embodiment includes: a multilayer structure including a semiconductor layer and a first ferromagnetic layer; a first wiring line electrically connected to the semiconductor layer; a second wiring line electrically connected to the first ferromagnetic layer; and a voltage applying unit electrically connected between the first wiring line and the second wiring line to apply a first voltage between the semiconductor layer and the first ferromagnetic layer during a write operation, a magnetization direction of the first ferromagnetic layer being switchable by applying the first voltage.

20 Claims, 17 Drawing Sheets

(56) References Cited

U.S. PATENT DOCUMENTS

| | | |
|---|---|---|
| 2004/0085681 A1* | 5/2004 | Kai et al. ............... 360/313 |
| 2008/0180859 A1 | 7/2008 | Ueda et al. |
| 2010/0238711 A1* | 9/2010 | Asao .................. 365/148 |
| 2011/0049659 A1 | 3/2011 | Suzuki et al. |
| 2012/0243308 A1* | 9/2012 | Saida et al. ............ 365/173 |

* cited by examiner

| | DIELECTRIC CONSTANT k | EOX FOR SiO$_2$ (MV/cm) | CONDUCTION BAND OFFSET FOR Si (eV) | CONDUCTION BAND OFFSET FOR Co (eV) |
|---|---|---|---|---|
| SiO$_2$ | 3.9 | 15 | 3.34 | 4.19 |
| Al$_2$O$_3$ | 9 | 31.8 | 2.95 | 3.8 |
| LaAlSiO | 15 | 25 | 2.4~2.7 | 3.25~3.55 |
| HfO$_2$ | 25 | 42.9 | 2.14 | 2.99 |
| LaAlO | 25 | 25 | 2.1 | 2.95 |
| ZrO$_2$ | 29 | 42.4 | 1.64 | 2.49 |
| La$_2$O$_3$ | 30 | 30.8 | – | – |
| TiO$_2$ | 95 | 60.9 | 0.28 | 1.13 |
| SrTiO$_3$ | 200 | 112.8 | -0.15 | 0.7 |
| BaTiO$_3$ | 2000 | 410.3 | -0.25 | 0.6 |
| Pb(Zr$_x$Ti$_{1-x}$)O$_3$ | 1000 | 512.8 | 0.45 | 1.3※ |
| (Ba$_x$Sr$_{1-x}$)TiO$_3$ | 500 | 256.4 | – | – |

※CoFe OR Fe MAY BE USED

FIG. 9

MAGNETIC MEMORY, SPIN ELEMENT, AND SPIN MOS TRANSISTOR

CROSS REFERENCE TO RELATED APPLICATIONS

This application is based upon and claims the benefit of priority from the prior Japanese Patent Application No. 2013-78005, filed on Apr. 3, 2013, the entire contents of which are incorporated herein by reference.

FIELD

Embodiments described herein relate generally to magnetic memories, spin elements, and spin MOS transistors.

BACKGROUND

Recently, attempts are actively made to use a magnetoresistive element with a tunnel magnetoresistance effect as a storage element in a magnetic random access memory. Such a magnetic random access memory using a magnetoresistive element as a storage element can store data in a nonvolatile manner, can perform write/read operations in a period of 10 ns or less, and can perform write operations $10^{15}$ times or more.

The writing to the magnetoresistive element is usually performed by a spin transfer torque magnetization switching method, in which the magnetization of a magnetic storage layer of the magnetoresistive element is switched by injecting spin-polarized electrons (spin-polarized current) into the magnetic storage layer. Since the amount of current needed for the writing decreases as the magnetic storage layer decreases in size, this is greatly expected as a writing method for magnetic random access memories.

However, the spin transfer torque magnetization switching is basically a current-controlled writing, and at present requires a large amount of current density, about 0.5 $MA/cm^2$. For this reason, several problems arise such as an increase in power consumption, an increase in size of periphery circuits, and an increase in area of cell selection transistors.

In order to solve these problems, recently, voltage-controlled magnetization switching writing (hereinafter also referred to as "voltage-controlled writing") is proposed. The voltage-controlled writing applies a voltage to the magnetization storage layer of the magnetoresistive element via an insulating film to change the number of electrons in the magnetization storage layer near the interface with the insulating film, thereby switching the magnetization direction of the magnetization storage layer. The aforementioned problems in conventional spin transfer torque magnetization switching methods can be solved by this writing method. Accordingly, magnetic random access memories with lower power consumption can be produced.

However, as described above, a memory employing the voltage-controlled writing should include an insulating film on the magnetic storage layer of the magnetoresistive element. This prevents a current from flowing through the magnetoresistive element. Therefore, the resistance of the magnetoresistive element cannot be read. Thus, it is not possible to produce magnetic random access memories by simply using the aforementioned method.

As described above, a magnetic random access memory employing the voltage-controlled writing method, which is recently receiving attention, preferably has an element structure that is different from the element structure of a spin transfer torque magnetization switching magnetic random access memory, simply because a resistance value cannot be read from a structure in which an insulating film and a write electrode are disposed on a magnetoresistive element.

BRIEF DESCRIPTION OF THE DRAWINGS

FIG. 9 is a diagram for explaining high dielectric materials used for spin elements.

DETAILED DESCRIPTION

A magnetic memory according to an embodiment includes: a multilayer structure including a semiconductor layer and a first ferromagnetic layer; a first wiring line electrically connected to the semiconductor layer; a second wiring line electrically connected to the first ferromagnetic layer; and a voltage applying unit electrically connected between the first wiring line and the second wiring line to apply a first voltage between the semiconductor layer and the first ferromagnetic layer during a write operation, a magnetization direction of the first ferromagnetic layer being switchable by applying the first voltage.

Embodiments will now be specifically explained with reference to the accompanying drawings.

(First Embodiment)

Figure 1A:
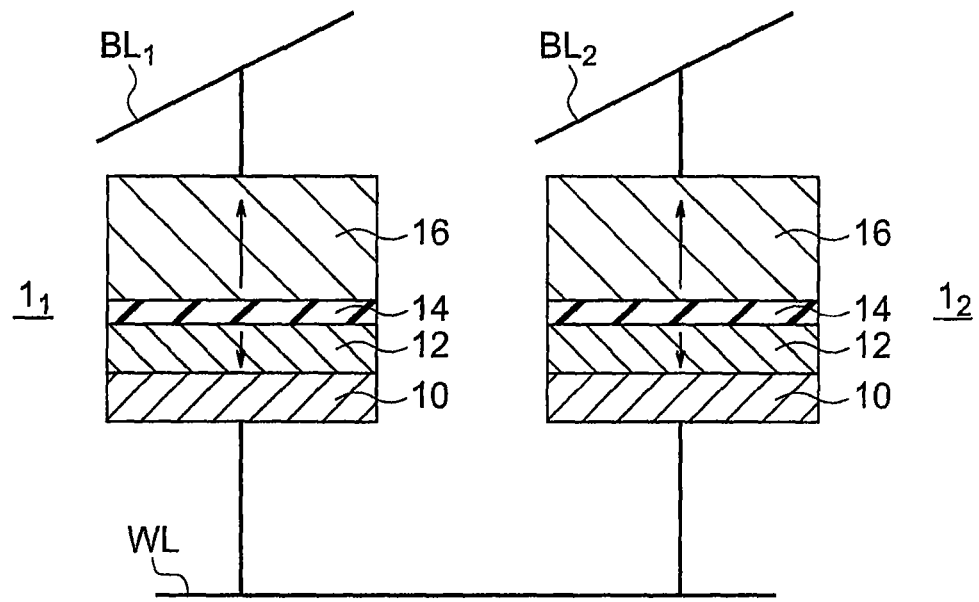
FIG. 1A is a diagram showing a magnetic memory according to the first embodiment.

A magnetic memory according to the first embodiment will be described with reference to FIG. 1A. The magnetic memory of the first embodiment includes a plurality of memory cells arranged in a matrix form. FIG. 1A shows two of such memory cells $1_1$, $1_2$. Each memory cell $1_i$ (i=1, 2) has a multilayer structure including a nonmagnetic layer 10, a ferromagnetic layer 12, a nonmagnetic layer 14, and a ferromagnetic layer 16. The nonmagnetic layer 10 of the memory cell $1_1$ is electrically connected to a word line WL, and the ferromagnetic layer 16 thereof is electrically connected to a bit line $BL_1$. The nonmagnetic layer 10 of the memory cell $1_2$ is electrically connected to the word line WL and the ferromagnetic layer 16 thereof is connected to a bit line $BL_2$. The expression "electrically connected" means that a conductor or wiring can be located between elements electrically connected with each other. For example, if the nonmagnetic layer 10 of the memory cell $1_1$ is electrically connected to the word line WL, a conductor or wiring may be located between the nonmagnetic layer 10' and the word line WL. Of course, the nonmagnetic layer 10 and the word line WL can be directly connected with each other. The connection may be changed so that the nonmagnetic layer 10 of each memory cell $1_i$ (i=1, 2) is electrically connected to the bit line, and the ferromagnetic layer 16 is electrically connected to the word line.

(Principle of Writing)

The principle of writing to the memory cells of the magnetic memory according to the first embodiment will be described below.

In the first embodiment, the nonmagnetic layer 10 is formed of an n-type semiconductor. Therefore, a Schottky barrier (Schottky diode) is formed between the nonmagnetic layer 10 and the ferromagnetic layer 12. As a result, if the potential of the ferromagnetic layer 12 is higher than that of the nonmagnetic layer 10, a current flows between the nonmagnetic layer 10 and the ferromagnetic layer 12, but if the potential of the ferromagnetic layer 12 is lower than that of the nonmagnetic layer 10, no current flows therebetween.

Thus, if a voltage is applied, using a voltage supply circuit (not shown), to the bit line BL and the word line WL so that that of the ferromagnetic layer 12 is higher than the potential of the nonmagnetic layer 10, a current flows between the nonmagnetic layer 10 and the ferromagnetic layer 12. As a result, a resistance of a magnetoresistive junction of the ferromagnetic layer 16/nonmagnetic layer 14/ferromagnetic layer 12 can be read, and from the degree of the resistance, the magnetization direction of the ferromagnetic layer 12 can be read.

Next, if a voltage is applied to the bit line BL and the word line WL so that the potential of the ferromagnetic layer 12 becomes lower than that of the nonmagnetic layer 10, the width of a depletion layer increases to increase the space charge in the semiconductor. An induced charge with a polarity opposite to that of the space charge is caused at the surface of the ferromagnetic layer 12, and the number of electrons of the ferromagnetic layer 12 is changed. As a result, the magnetic anisotropy of the ferromagnetic layer 12 changes to ultimately switch the magnetization. Thus, it is possible to switch the magnetization direction of the ferromagnetic layer 12 without causing a current to flow between the nonmagnetic layer 10 and the ferromagnetic layer 12.

Based on the aforementioned principle, a read operation and a voltage-controlled writing operation can be performed using the memory cells of the first embodiment. Therefore, according to the first embodiment, it is possible to provide a magnetic memory including a magnetoresistive element capable of voltage-controlled writing and of reading a resistance value.

Although an n-type semiconductor is used to form the nonmagnetic layer 10, a p-type semiconductor can also be used. In such a case, the degree of voltage to be applied to the bit line and the word line is opposite to that in the case where the nonmagnetic layer 10 is formed of an n-type semiconductor.

Furthermore, although an example of using perpendicular magnetization films, in which the magnetization direction is perpendicular to a film plane, as the ferromagnetic layers 12, 16 in FIG. 1A, in-plane magnetization films, in which the magnetization direction is parallel to the film plane, can also be used. The film plane means a plane substantially perpendicular to the layer-stacking direction. Moreover, an antiferromagnetic film for adjusting magnetic characteristics may be located near the ferromagnetic layer 16.

In the write operation, the magnetization direction of the ferromagnetic layer is controlled to be directed to a desired direction by applying a pulsed voltage to a desired cell and controlling the width of the pulses applied to the cell or the number of times the pulses are applied to the cells.

Figure 1B:
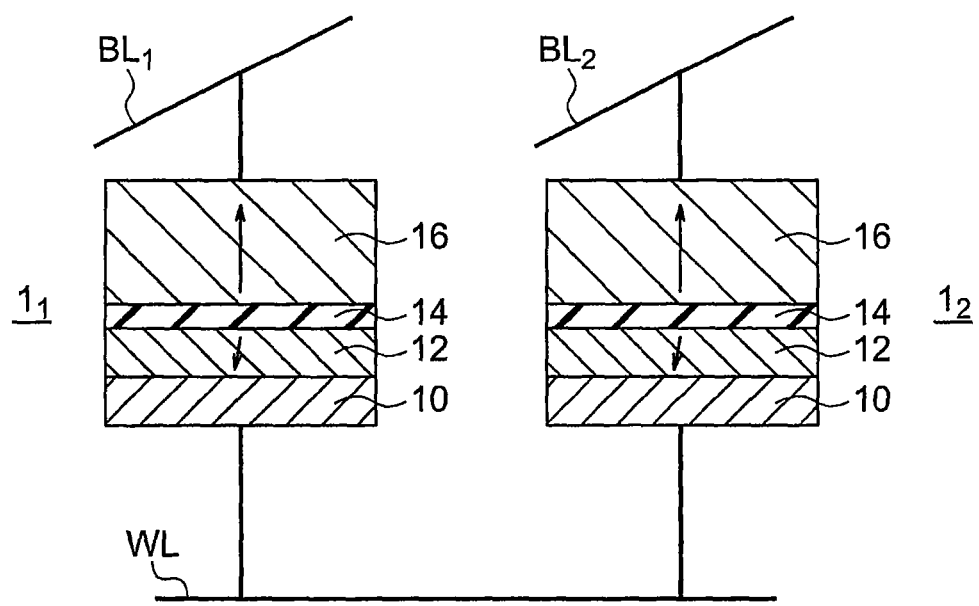
FIG. 1B is a diagram showing a magnetic memory according to the first modification of the first embodiment.

In order to perform the magnetization switching writing easily, the magnetization direction of the ferromagnetic layer 12 serving as a recording layer may be tilted as in the first modification shown in FIG. 1B. The same can be said for the following modifications and embodiments.

Using the magnetic memory of the first embodiment, a memory array can be formed by simply arranging the memory cells in a matrix form. The reason for this is the Schottky barrier located between the nonmagnetic layer 10 and the ferromagnetic layer 12. Due to the Schottky barrier, it is not necessary to separately provide a diode for preventing a sneak current.

(Second Modification)

Figure 2:
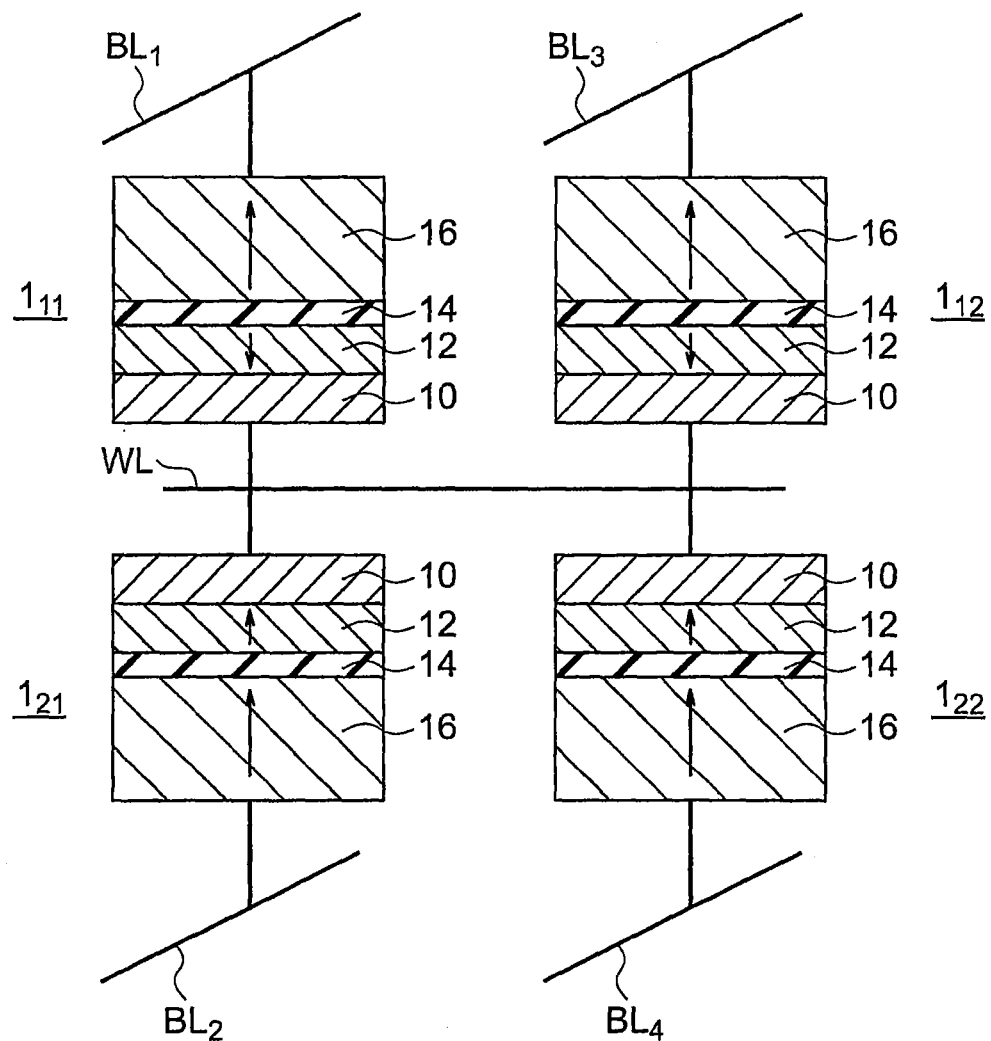
FIG. 2 is a magnetic memory according to the second modification of the first embodiment.

A magnetic memory according to the second modification of the first embodiment will be described with reference to FIG. 2. The magnetic memory of the second modification includes four memory cells $1_{11}$, $1_{12}$, $1_{21}$, $1_{22}$. Each memory cell $1_{ij}$ (i, j=1, 2) has a multilayer structure including a nonmagnetic layer 10, a ferromagnetic layer 12, a nonmagnetic layer 14, and a ferromagnetic layer 16 as in each memory cell of the first embodiment. The nonmagnetic layer 10 of each memory cell $1_{ij}$ (i, j=1, 2) is electrically connected to a common word line WL. The ferromagnetic layer 16 of each of the memory cells $1_{11}$, $1_{21}$ is electrically connected to a bit line $BL_1$ or $BL_2$, and the ferromagnetic layer 16 of each of the memory cells $1_{12}$, $1_{22}$ is electrically connected to a bit line $BL_3$ or $BL_4$. As a result, the stacking order of the multilayer structure including the nonmagnetic layer 10, the ferromagnetic layer 12, the nonmagnetic layer 14, and the ferromagnetic layer 16 of the memory cells $1_{11}$, $1_{12}$ is opposite to that of the memory cells $1_{21}$, $1_{22}$.

According to the configuration of the second modification, a three-dimensional memory array that is more compact in size can be formed.

According to the second modification, it is possible to provide a magnetic memory including a magnetoresistive element capable of voltage-controlled writing and of reading a resistance value as in the case of the first embodiment.

(Second Embodiment)

Figure 3:
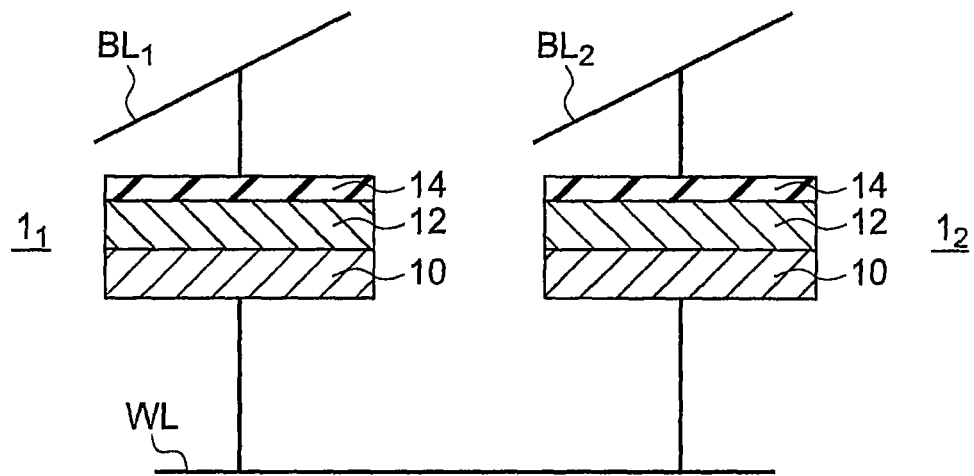
FIG. 3 is a diagram showing a magnetic memory according to the second embodiment.

A magnetic memory according to the second embodiment will be described with reference to FIG. 3. The magnetic memory according to the second embodiment includes a plurality of memory cells arranged in a matrix form. FIG. 3 shows two of such memory cells $1_1$, $1_2$. Each memory cell $1_i$ (i=1, 2) has a multilayer structure including a nonmagnetic layer 10, a ferromagnetic layer 12, and a nonmagnetic layer 14. The nonmagnetic layer 10 of the memory cell $1_1$ is electrically connected to a word line WL, and the nonmagnetic layer 14 thereof is electrically connected to a bit line $BL_1$. The nonmagnetic layer 10 of the memory cell $1_2$ is electrically connected to the word line WL, and the nonmagnetic layer 14 thereof is electrically connected to a bit line $BL_2$. The nonmagnetic layer 10 of the memory cell $1_1$ may be electrically connected to the bit line $BL_1$, the nonmagnetic layer 14 thereof may be electrically connected to the word line WL, the nonmagnetic layer 10 of the memory cell $1_2$ may be electrically connected to the bit line $BL_2$, and the nonmagnetic layer 14 thereof may be electrically connected to the word line WL.

In the second embodiment, the ferromagnetic layer 12 is formed of an oxide magnetic material such as Co—Fe—O. The use of an oxide magnetic material may improve the writing efficiency since the number of electrons used for the voltage-controlled writing increases as compared to the case where a metal ferromagnetic material is used.

If a material having a spin-filter effect such as Co—Fe—O is used to form the ferromagnetic layer 12, the junction resistance of the multilayer structure, nonmagnetic layer 10/ferromagnetic layer 12/nonmagnetic layer 14, changes in accordance with the magnetization state of the ferromagnetic layer 12. As a result, the magnetization state of the ferromagnetic layer 12 can be read without forming a magnetic tunneling junction (MTJ). The material of the ferromagnetic layer 12 may also be ferrite ($Fe_xO_y$), or ferrite with other element to adjust the characteristics thereof (for example, $AFe_xO_y$, (where A is at least one element selected from the group consisting of Mn, Co, Ni, Cu, Zn, Ba, Sr, and Pb)). The aforementioned oxide magnetic material includes ferrite and ferrite with other element.

Furthermore, a Mn-based magnetic material (such as $Ni_aFe_bCo_cMn_d$ mixed with other element to adjust the characteristics thereof and $Ni_{50}Mn_{37-x}Fe_xIn_{13}$) may be used to form the ferromagnetic layer 12, or a Heusler magnetic material (such as $X_aQ_bZ_c$ (where X is at least one element selected from the group consisting of Fe, Co, Ni, Cu, Zn, Ru, Rh, Pd, Ag, Cd, Ir, Pt, and Au, Q is at least one element selected from the group consisting of Ti, V, Cr, Mn, Y, Zr, Nb, Hf, and Ta, and Z is at least one element selected from the group consisting of Al, Si, Ga, Ge, As, In, Sn, Sb, Tl, Pd, and Bi)) may also be used.

These materials may be used to adjust the precession cycle of the ferromagnetic in the ferromagnetic layer 12. In a write operation using the precession of a ferromagnetic, if the precession of the ferromagnetic layer 12 is short, a pulse with a short width should be used. However, depending on the actual circuit configuration, sometimes such a pulse with a short width cannot be applied. In such a case, if one of the aforementioned materials is used to form the ferromagnetic layer 12, the writing time can be elongated. As a result, a pulse with a longer width can be used for the write operation.

In order to improve the MR ratio, the multilayer structure may include such films as CoFe, Fe, and CoFeB between the ferromagnetic layer 12 and the nonmagnetic layer 14.

As described above, according to the second embodiment, it is possible to provide a magnetic memory including a magnetoresistive element capable of voltage-controlled writing, and of reading a resistance value.

Furthermore, as in the case of the second modification of the first embodiment, the order of stacking the layers is not limited to the described order, but can be reversed to form the three-dimensional memory array. Thus, the configuration of the second embodiment may be such that the ferromagnetic layer 16 is removed from each memory cell $1_{11}$-$1_{22}$ of the magnetic memory according to the second modification of the first embodiment shown in FIG. 2.

(Third Embodiment)

Figure 4:
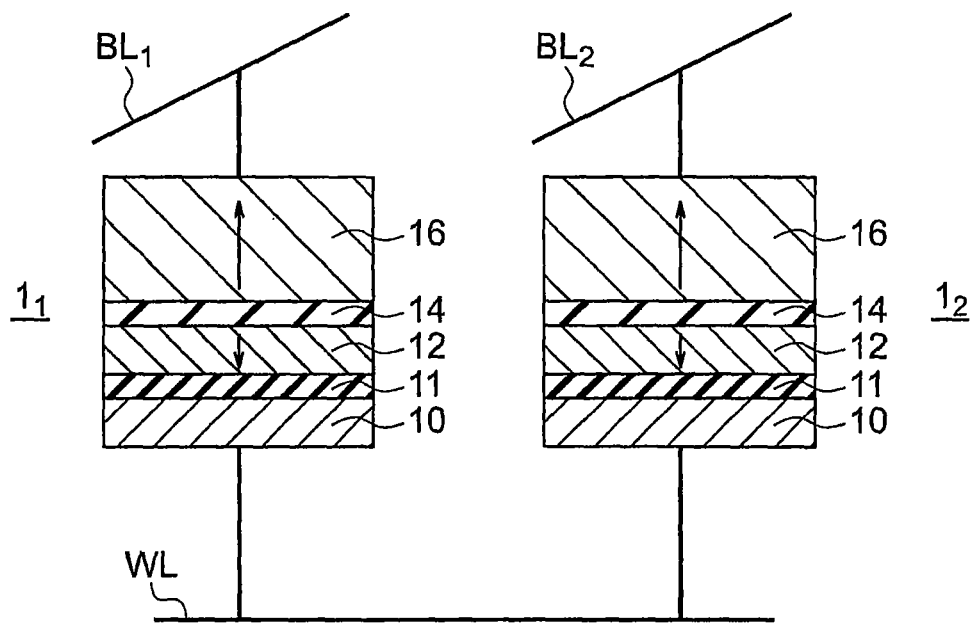
FIG. 4 is a diagram showing a magnetic memory according to the third embodiment.

A magnetic memory according to the third embodiment will be described with reference to FIG. 4. The magnetic memory according to the third embodiment includes a plurality of memory cells arranged in a matrix form. FIG. 4 shows two of such memory cells $1_1$, $1_2$. Each memory cell $1_i$ (i=1, 2) of the third embodiment is obtained by disposing an insulating film 11 between the nonmagnetic layer 10 and the ferromagnetic layer 12 in each memory cell of the first embodiment shown in FIG. 1A. Specifically, each memory cell $1_i$ (i=1, 2) has a multilayer structure including a nonmagnetic layer 10, an insulating film 11, a ferromagnetic layer 12, a nonmagnetic layer 14, and a ferromagnetic layer 16. The nonmagnetic layer 10 of the memory cell $1_1$ is electrically connected to a word line WL, and the ferromagnetic layer 16 thereof is electrically connected to a bit line $BL_1$. The nonmagnetic layer 10 of the memory cell $1_2$ is electrically connected to the word line WL, and the ferromagnetic layer 16 thereof is electrically connected to a bit line $BL_2$. The nonmagnetic layer 10 of the memory cell $1_1$ may be electrically connected to the bit line $BL_1$, the ferromagnetic layer 16 thereof may be electrically connected to the word line WL, the nonmagnetic layer 10 of the memory cell $1_2$ may be electrically connected to the bit line $BL_2$, and the ferromagnetic layer 16 thereof may be electrically connected to the word line WL.

The order of stacking the layers is not limited to the described order as in the case of the second modification of the first embodiment, and the order may be reversed to form a three-dimensional memory array.

The magnetic memory according to the third embodiment differs from the magnetic memory according to the first embodiment in that the insulating film 11 is disposed between the nonmagnetic layer 10 and the ferromagnetic layer 12. By disposing the insulating film 11, the interface state at the interface between the nonmagnetic layer 10 and the ferromagnetic layer 12 can be reduced. If the interface state is present, the amount of induced charge generated at the surface of the ferromagnetic layer 12 when a voltage is applied between the nonmagnetic layer 10 and the ferromagnetic layer 16 decreases, and thus the efficiency of magnetization switching writing deteriorates. By disposing the insulating film 11 to reduce the interface state, the writing efficiency can be improved as compared to the first embodiment.

As described above, according to the third embodiment, it is possible to provide a magnetic memory including a magnetoresistive element capable of voltage-controlled writing and of reading a resistance value.

In each of the first to the third embodiments, the nonmagnetic layer 10 is a semiconductor layer. A magnetic memory including a nonmagnetic metal layer that serves as the nonmagnetic layer 10 will be described as the fourth embodiment.

(Fourth Embodiment)

Figure 5:
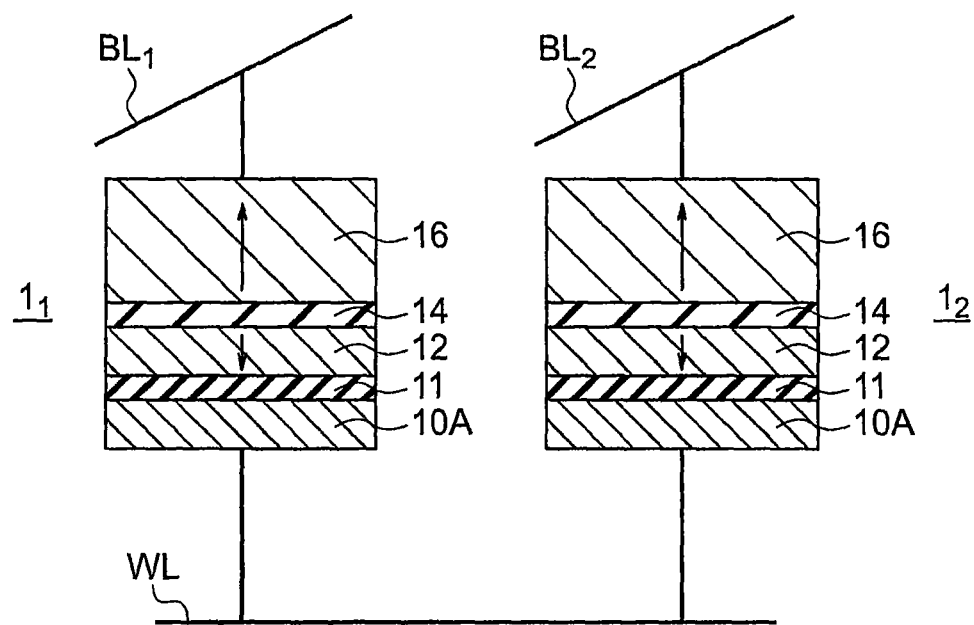
FIG. 5 is a diagram showing a magnetic memory according to the fourth embodiment.

The magnetic memory according to the fourth embodiment will be described with reference to FIG. 5. The magnetic memory according to the fourth embodiment has a structure obtained by replacing the nonmagnetic layer 10 that is a semiconductor layer of each memory cell $1_1$, $1_2$ of the magnetic memory according to the third embodiment with a nonmagnetic metal layer 10A.

In the fourth embodiment, the multilayer structure, nonmagnetic layer 10A/insulating film 11/ferromagnetic layer 12, has a metal/insulator/metal junction diode, which is so-called MIM diode. If the materials are selected so that the work function of the nonmagnetic layer 10A differs from that of the ferromagnetic layer 12, the ON voltage at the positive side of the MIM diode becomes different from the ON voltage at the negative side. Accordingly, a write operation and a read operation can be compatibly performed by a single memory cell by performing a voltage-controlled writing operation using the side where the ON voltage is high, and by performing a read operation using the side where the ON voltage is low.

Other diodes, such as a PN diode, can also be used although a Schottky diode or MIM diode is preferable from the viewpoint of applying a voltage to the ferromagnetic layer. In such a case, the memory cell includes a PN diode, and a ferromagnetic layer connected to the PN diode, and during a write operation, a reverse-bias voltage is applied to the PN diode, and during a read operation, a forward-bias voltage is applied.

As described above, according to the fourth embodiment, it is possible to provide a magnetic memory including a magnetoresistive element capable of voltage-controlled writing, and of reading a resistance value.

Furthermore, as in the second modification of the first embodiment, the stacking order is not limited to the described order, but can be reversed to form a three-dimensional memory array.

(Fifth Embodiment)

Figure 6:
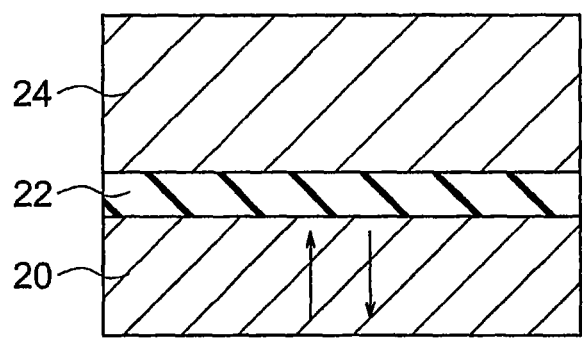
FIG. 6 is a cross-sectional view showing a spin element included in the fifth embodiment.

FIG. 6 shows a voltage-controlled writing spin element (hereinafter referred to as the "spin element") included in a magnetic memory according to the fifth embodiment. The spin element 2 according to the fifth embodiment has a multilayer structure including a ferromagnetic layer 20, a high dielectric layer 22, and a nonmagnetic layer 24.

In the spin element 2, the charge at the interface of the ferromagnetic layer 20 in contact with the high dielectric layer 22 increases (or decreases) when a positive (negative) voltage is applied between the ferromagnetic layer 20 and the nonmagnetic layer 24, thereby switching the magnetization direction. If the voltage applied is changed to zero again, the magnetization direction after being switched is maintained.

Then, the charge at the interface of the ferromagnetic layer 20 in contact with the high dielectric layer decreases (or increases) when a negative (positive) voltage is applied between the ferromagnetic layer 20 and the nonmagnetic layer 24, thereby switching the magnetization direction. If the voltage applied is changed to zero again, the magnetization direction switched is maintained.

The magnetization information can be written to the ferromagnetic layer 20 of the spin element 2. A racetrack magnetic memory can be formed using the spin element 2.

An insulating material including titanium oxide having a high relative dielectric constant or an insulating material including an oxide containing titanium oxide and at least one element selected from Group 2 elements, Group 3 elements, Group 4 elements, Group 5 elements, and lanthanide elements is used to form the high dielectric layer 22. Such insulating materials preferably have a relative dielectric constant of 50 or more, and a band offset of 1 eV or more with a ferromagnetic element.

Figure 7:
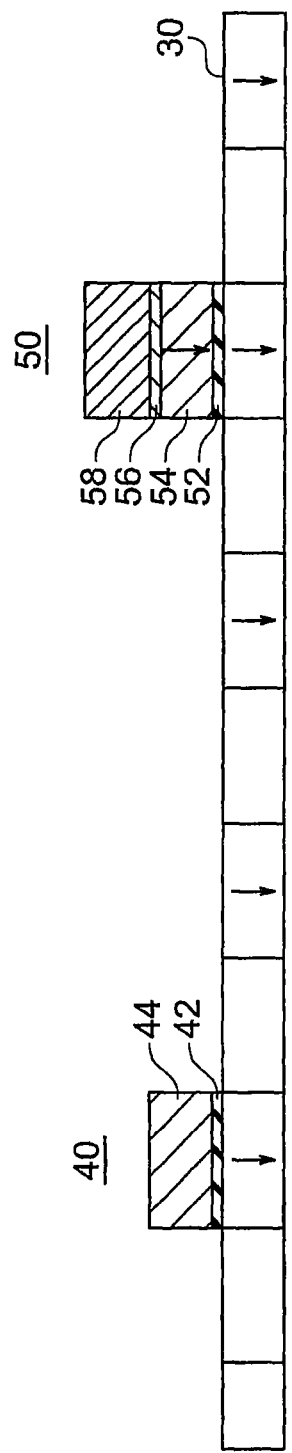
FIG. 7 is a cross-sectional view showing a magnetic memory according to the fifth embodiment.

Next, a racetrack magnetic memory including a spin element 2, which serves as the magnetic memory of the fifth embodiment will be described below. FIG. 7 is a cross-sectional view showing the racetrack magnetic memory according to the fifth embodiment. The racetrack magnetic memory includes a magnetic nanowire (magnetic nanowire) 30, a write unit 40, and a read unit 50.

The write unit 40 has a multilayer structure including a ferroelectric layer 42 and a nonmagnetic layer 44. The ferroelectric layer 42 is located close to the magnetic nanowire, and the nonmagnetic layer 44 is located on a side of the ferroelectric layer 42 opposite to the magnetic nanowire 30. The ferroelectric layer 42 and the nonmagnetic layer 44 of the write unit 40 together with the magnetic nanowire 30 form a voltage-controlled writing spin element shown in FIG. 6.

The magnetization direction at the interface of the magnetic nanowire 30 in contact with the high dielectric layer 42 is switched when a positive (negative) voltage is applied between the magnetic nanowire 30 and the nonmagnetic layer 44. When the voltage applied is changed to zero again, the magnetization direction in the magnetic nanowire 30 that is switched is maintained. The magnetization maintained is read as magnetization information (magnetization direction) by the read unit 50 by applying a current pulse to the magnetic nanowire 30 in the direction along which the magnetic nanowire 30 extends to move the magnetic domain. The read unit 50 includes a high dielectric layer 52, a ferromagnetic layer 54, in which the direction of magnetization is fixed, a nonmagnetic layer 56, and an electrode 58. The high dielectric layer 52, the ferromagnetic layer 54, the nonmagnetic layer 56, and the electrode 58 of the read unit 50 together with the magnetic nanowire 30 form an MTJ element.

If a negative (positive) voltage is applied between the magnetic nanowire 30 and the nonmagnetic layer 44, the magnetization direction at the interface of the magnetic nanowire 30 in contact with the high dielectric layer 42 is switched, and if the voltage applied is changed to zero again, the magnetization direction of the magnetic nanowire 30 is maintained to be in the switched state. The magnetization maintained is read as magnetization information by the read unit 50 by applying a current pulse to the magnetic nanowire 30 in the direction along which the magnetic nanowire 30 extends to move the magnetic domain.

As described above, according to the fifth embodiment, it is possible to provide a magnetic memory including a magnetoresistive element capable of voltage-controlled writing, and of reading a resistance value.

(Sixth Embodiment)

Figure 8:
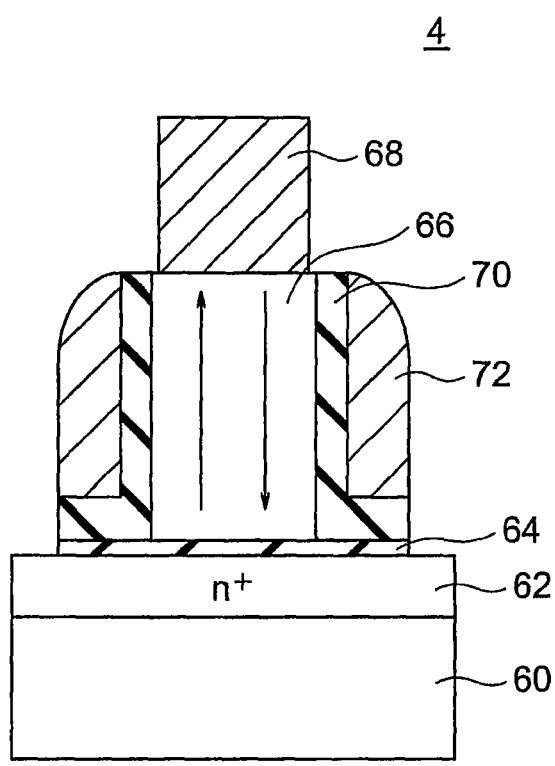
FIG. 8 is a cross-sectional view showing a spin element according to the sixth embodiment.

A magnetic memory according to the sixth embodiment will be described with reference to FIG. 8. The magnetic memory according to the sixth embodiment includes a voltage-controlled writing spin element (hereinafter referred to as the "spin element"). FIG. 8 shows such a spin element. The spin element 4 is formed on an $n^+$-type semiconductor region 62 on a semiconductor layer 60. The semiconductor layer 60 may be a bulk semiconductor substrate, or a silicon on insulator (SOI) layer of an SOI substrate. The spin element 4 includes a tunnel insulating film 64 formed on the $n^+$-type semiconductor region 62, a ferromagnetic layer 66 formed on the tunnel insulating film 64, an electrode 68 of a nonmagnetic material formed on the ferromagnetic layer 66, a high dielectric layer 70 formed on a side portion of the ferromagnetic layer 66, and a nonmagnetic layer 72 formed on a side of the ferroelectric layer 70 opposite to the ferromagnetic layer 66. Specifically, the nonmagnetic layer 72 is formed on the side portion of the ferromagnetic layer 66, and the high dielectric layer 70 is disposed between the ferromagnetic layer 66 and the nonmagnetic layer 72. In the magnetic memory shown in FIG. 8, the tunnel insulating film 64 is disposed between the semiconductor region 62 and the ferromagnetic layer 66. However, if the conductance mismatch between the semiconductor region 62 and the ferromagnetic layer 66 is eliminated by selecting appropriate materials, the tunnel insulating film 64 is not needed.

The magnetization direction at the interface of the ferromagnetic layer 66 in contact with the high dielectric layer 70 is switched when a positive (negative) voltage is applied between the electrode 68 and the nonmagnetic layer 72, or between the semiconductor region 62 and the nonmagnetic layer 72 in the sixth embodiment. If the voltage applied is changed to zero again, the magnetization direction switched in the ferromagnetic layer 66 is maintained.

Then, the magnetization direction at the interface of the ferromagnetic layer 66 in contact with the high dielectric layer is switched by applying a negative (positive) voltage between the electrode 68 and the nonmagnetic layer 72, or between the semiconductor region 62 and the nonmagnetic layer 72. If the voltage applied is changed to zero again, the magnetization direction switched in the ferromagnetic layer 66 is maintained.

In the sixth embodiment, the magnetization state maintained by the voltage control can be read with a lower power consumption through a low-resistance conducting path between the electrode 68 and the semiconductor region 62.

A lateral spin MOS field effect transistor and a longitudinal spin MOS field effect transistor can be formed using the spin element shown in FIG. 8.

An insulating material including titanium oxide having a high relative dielectric constant or an insulating material an oxide containing a titanium oxide and at least one element selected from Group 2 elements, Group 3 elements, Group 4 elements, Group 5 elements, and lanthanide elements can be used to form the high dielectric layer 70. FIG. 9 shows examples of such insulating materials. As can be understood from FIG. 9, the aforementioned insulating materials have a high relative dielectric constant, but have a band-offset of less than 1 eV with a semiconductor material such as Si. Accordingly, a leakage current is easily caused, and the thermal stability is not good. For this reason, the aforementioned materials are unsatisfactory to be used to form an insulating film for a semiconductor material. However, the aforementioned materials have a band-offset of 1 eV or more with a ferromagnetic material that has a higher work function than semiconductor materials, and thus the thermal stability thereof is good. Accordingly, the aforementioned insulating materials can be used with ferromagnetic materials.

A method of manufacturing the spin element 4 will be described with reference to FIG. 10. First, a semiconductor region 62 to serve as a channel is formed by ion implantation and annealing in a semiconductor layer 60, and a tunnel insulating film 64 and a ferromagnetic layer 66 are sequentially formed on the semiconductor layer 60. The tunnel insulating film 64 is disposed to eliminate the conductance mismatch between the semiconductor region 62 and the ferromagnetic layer 66. If the materials of the semiconductor region 62 and the ferromagnetic layer 66 are selected to eliminate the conductance mismatch, the tunnel insulating film 64 is not needed. In such a case, a thin silicon oxide film (not shown) may be disposed to protect the surface of the semiconductor region 62 formed of, for example, polycrystalline silicon.

Next, a resist 80 is applied onto the ferromagnetic layer 66, and patterned by means of a stepper. Thereafter, the ferromagnetic layer 66 is removed by reactive ion etching (RIE) or milling method except for a portion on which an electrode 68 is formed.

Subsequently, a high dielectric layer 70 and a nonmagnetic layer 72 are sequentially formed, and then the resist 80 is removed.

Figure 10:
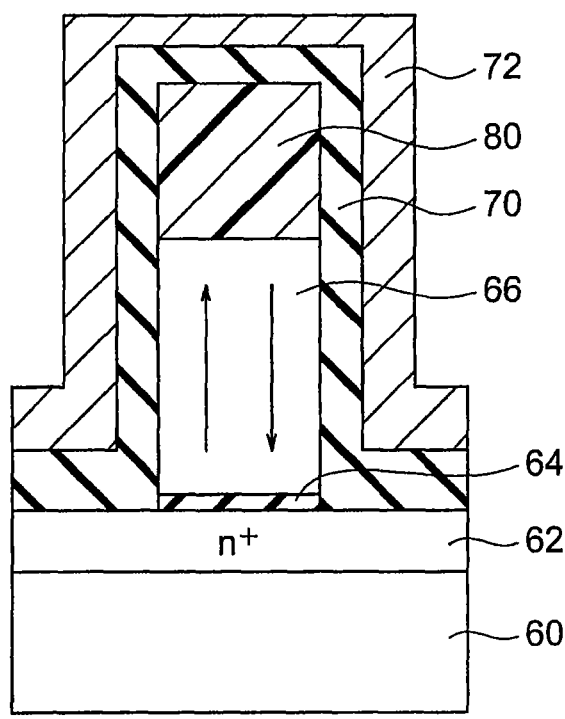
FIG. 10 is a cross-sectional view for explaining a method of manufacturing the spin element according to the sixth embodiment.

The thickness of a portion of the high dielectric layer 70 in contact with the semiconductor region 62 can be increased, and that of a portion in contact with a sidewall of the ferromagnetic layer 66 can be decreased by employing a sputtering method with a strong directivity as shown in FIG. 10. In this manner, the leakage current between the semiconductor region 62 and the nonmagnetic layer 72 can be prevented.

Thereafter, a resist (not shown) is applied and patterned by using a stepper. The pattern is removed by an inclined milling method except for the portion through which a voltage can be applied to the nonmagnetic layer 72. Then, the resist is removed, and an electrode 68 is formed on the ferromagnetic layer 66 to form the spin element 4 shown in FIG. 8.

Next, a lateral spin-based meta-oxide-semiconductor (MOS) field effect transistor and a longitudinal spin-based MOS field effect transistor using the spin element 4 of the sixth embodiment will be described.

(Lateral Spin-Based MOS Field Effect Transistor)

Figure 11:
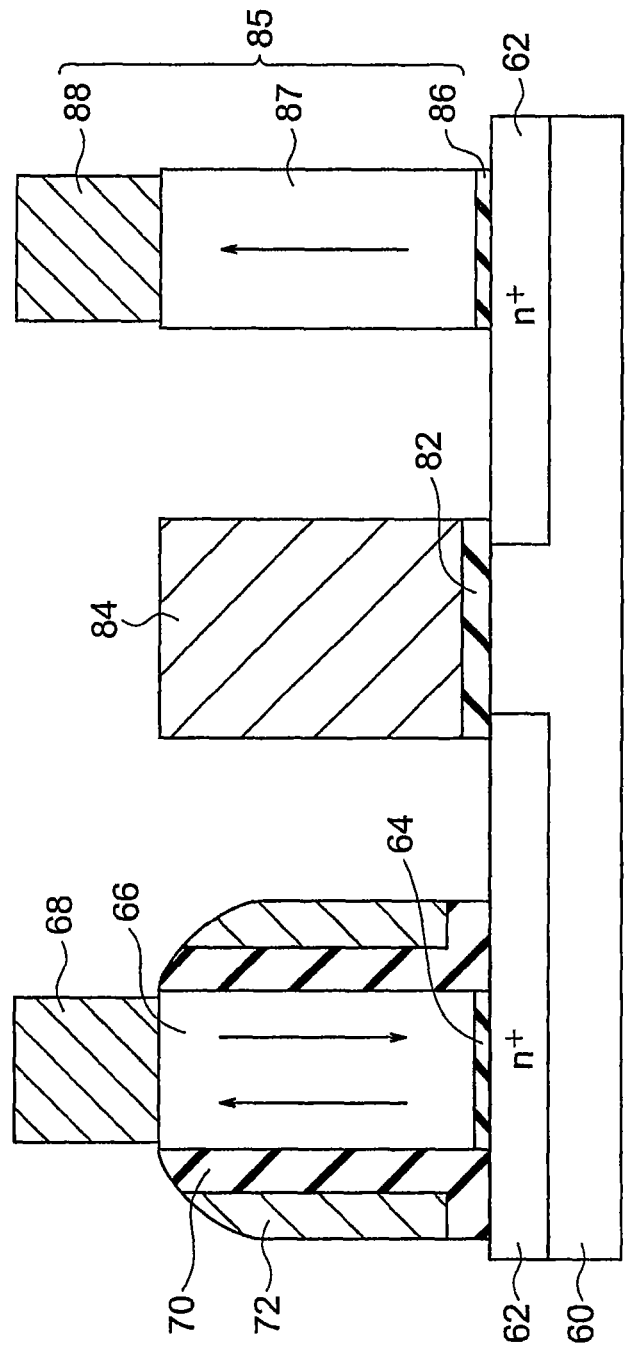
FIG. 11 is a cross-sectional view showing a lateral spin MOS transistor.

FIG. 11 is a cross-sectional view of a lateral spin-based MOS field effect transistor (hereinafter also referred to as the "spin MOS transistor" or "transistor") 80 using the spin element 4 of the sixth embodiment. The transistor 80 includes source and drain regions 62 formed in a semiconductor region 60, a gate insulating film 82 formed on a semiconductor region to serve as a channel region between the source region and the drain region, a gate electrode 84 formed on the gate insulating film 82, a spin element 4 formed on one of the source and the drain regions 62, and a multilayer structure 85 formed on the other of the source and the drain regions 62 and including a ferromagnetic layer 87. The multilayer structure 85 includes an insulating film 86 formed on the other of the source and the drain regions 62, the ferromagnetic layer 87 formed on the insulating film 86, the magnetization direction of the ferromagnetic layer 87 being fixed, and a nonmagnetic electrode 88 formed on the ferromagnetic layer 87.

In the transistor 80 thus constituted, the ferromagnetic layer 66 of the spin element 4 serves as a magnetization free layer. The magnetization direction of the magnetization free layer 66 can be set by the voltage-controlled writing to the spin element 4 described above. If the magnetization direction of the ferromagnetic layer 66 of the spin element 4 is parallel to (in the same direction as) the magnetization direction of the ferromagnetic layer 87 of the multilayer structure 85, the resistance of an electric path between the electrode 68 and the electrode 88 through the channel region of the transistor 80 becomes low when a voltage is applied to the gate electrode 84. On the contrary, if the magnetization direction of the ferromagnetic layer 66 of the spin element 4 is antiparallel to (opposite to) the magnetization direction of the ferromagnetic layer 87 of the multilayer structure 85, the resistance of the electric path between the electrode 68 and the electrode 88 through the channel region of the transistor 80 becomes high when a voltage is applied to the gate electrode 84.

Although the electrodes 68, 88, which are formed of a nonmagnetic material, are separated from the gate electrode 84 in FIG. 11, the gate electrode 84 can be formed to be integral with the nonmagnetic electrodes 68, 88. In such a case, the voltage applied for the voltage-controlled writing is preferably higher than the gate voltage needed to turn on the channel region.

(Method of Manufacturing Lateral Spin-Based MOS Field Effect Transistor)

Next, a method of manufacturing a lateral spin-based MOS field effect transistor 80 will be described with reference to FIGS. 11 and 12.

Figure 12:
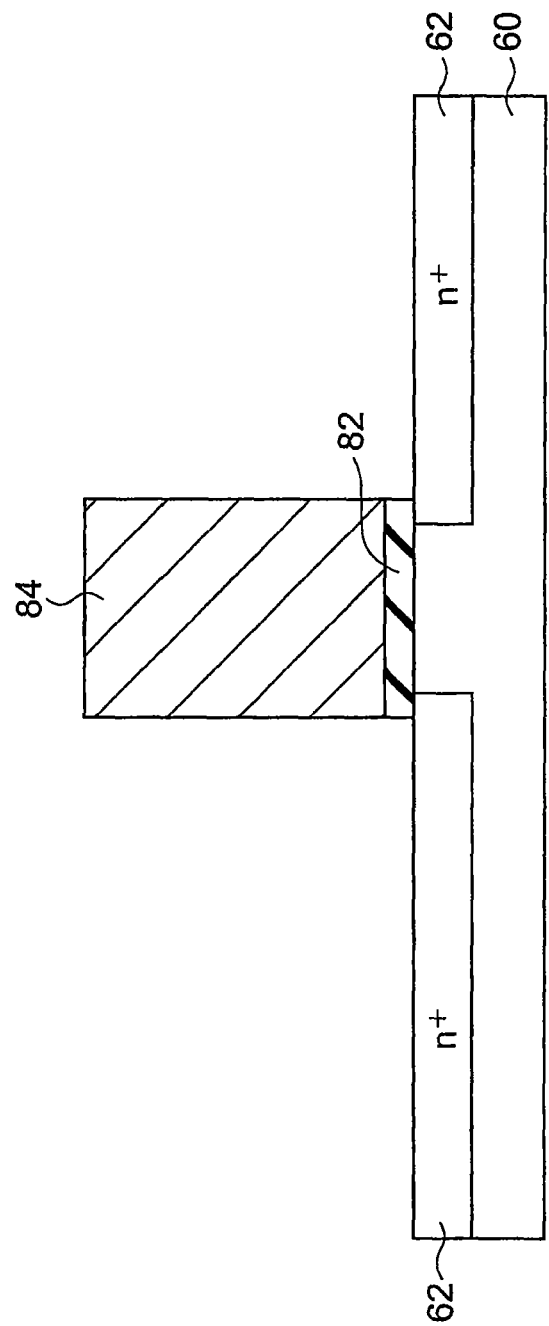
FIG. 12 is a cross-sectional view showing a method of manufacturing a lateral spin MOS transistor.

First, a gate insulating film 82 and a gate electrode 84 are formed on a semiconductor layer 60 using a well-known method, as shown in FIG. 12. Thereafter, an impurity is implanted into the semiconductor layer 60 using the gate electrode 84 as a mask, thereby forming source and drain regions 62. The method for forming the source and the drain regions is not limited, as long as a common method is used.

Thereafter, the native oxide films formed on the surfaces of the semiconductor of the source and the drain regions 62 is removed, and a tunnel insulating film and a ferromagnetic layer are sequentially formed. Subsequently, a resist is applied on the semiconductor layer, and a resist pattern (not shown) is formed by using a lithographic technique. The ferromagnetic layer and the tunnel insulating film are patterned using the resist pattern as a mask, the ferromagnetic layer except for the portions on the source and the drain regions is removed by reactive ion etching (for example, RIE for magnetic materials) or milling method, and the resist pattern is removed. As a result, tunnel insulating films 64, 86 and ferromagnetic layers 66, 87 are formed.

Then, a high dielectric layer 70, and a nonmagnetic layer 72 are sequentially formed. Thereafter, a resist is applied, and a resist pattern (not shown) is formed using a lithographic technique. The ferromagnetic layers and the tunnel insulating films are patterned using the resist pattern as a mask. Then, the nonmagnetic layer and the high dielectric layer except for at least one of the portions where the source and the drain regions (hereinafter also referred to as the "source/drain regions") are present are removed by the reactive ion etching or milling method, and the resist is removed. At this time, an inclined milling method is preferably used so that the nonmagnetic layer and the high dielectric layer 70 formed on the gate electrode 84 or the sidewalls of one of the source/drain regions can be removed more easily.

Finally, electrodes are formed on the upper portions of the ferromagnetic layers 66, 87 and the nonmagnetic layer 72, thereby completing a spin MOS field effect transistor 80 including a voltage-controlled writing spin element 4.

(Longitudinal Spin-Based MOS Field Effect Transistor)

Figure 13:
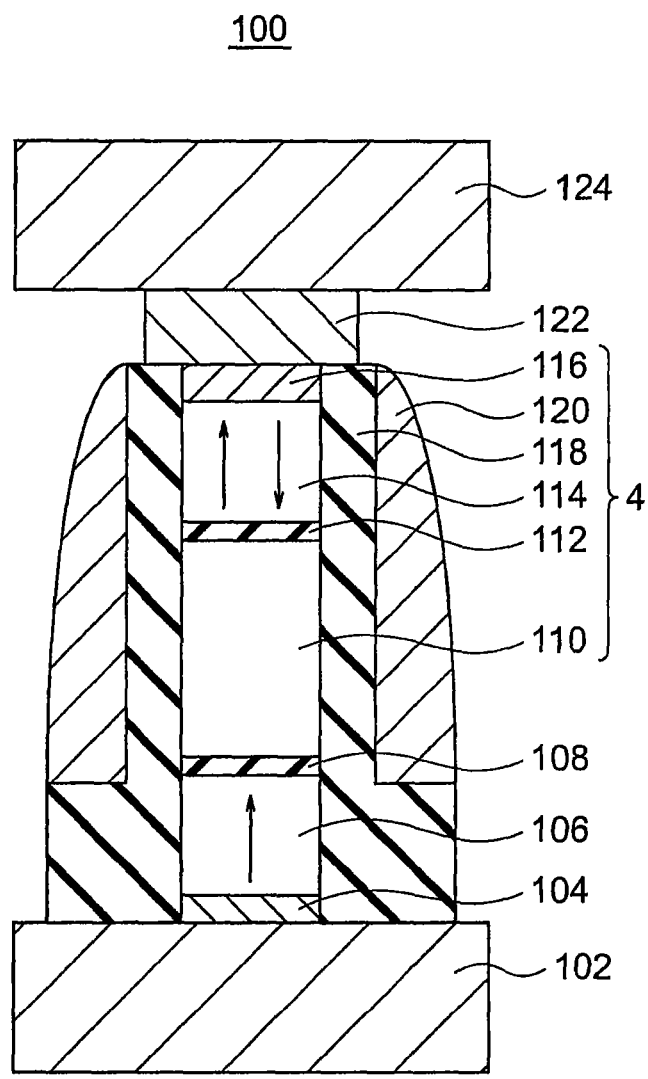
FIG. 13 is a cross-sectional view showing a longitudinal spin MOS transistor.

Next, a longitudinal spin-based metal-oxide semiconductor (MOS) field effect transistor (hereinafter also referred to as the "spin MOS transistor" or "transistor") 100 including the spin element according to the sixth embodiment will be described. FIG. 13 is a cross-sectional view of the transistor 100 including the spin element 4 according to the sixth embodiment.

The voltage-controlled writing spin element 4 according to the sixth embodiment is formed on one of the source and the drain of the transistor 100. The transistor 100 includes a base layer 104 formed on a lower electrode 102, and a multilayer structure formed on the base layer 104. The multilayer structure includes a ferromagnetic layer 106, in which the direction of magnetization is fixed, a tunnel insulating film 108, a semiconductor layer 110, a tunnel insulating film 112, and a ferromagnetic layer 114, which are stacked in this order on the base layer 104. The stacking order of the multilayer structure may be reversed from the stacking order shown in FIG. 13. Thus, the ferromagnetic layer 114, the tunnel insulating film 112, the semiconductor layer 110, the tunnel insulating film 108, and the ferromagnetic layer 106, in which the direction of magnetization is fixed, can be stacked in this order on the base layer 104.

A cap layer 116 of a nonmagnetic metal is formed on the top surface of the multilayer structure, an upper electrode 124 is formed above the cap layer 116, and the cap layer 116 and the upper electrode 124 are electrically connected with each other through a contact 122.

A gate electrode 120 of a nonmagnetic material is formed on a side portion of the multilayer structure, and a ferroelectric layer 118 is disposed between the gate electrode 120 and the multilayer structure. In FIG. 13, the high dielectric layer 118 extends over the lower electrode 102, in addition to the side portion of the multilayer structure. The thickness of the high dielectric layer 118 on the lower electrode 102 is thicker than the thickness thereof on the side portion of the multilayer structure. This electrically insulates the lower electrode 102 from the gate electrode 120. The semiconductor layer 110, the tunnel insulating film 112, the ferromagnetic layer 114, the high dielectric layer 118, and the nonmagnetic electrode 120 correspond to the semiconductor layers 60, 62, the tunnel insulating film 64, the ferromagnetic layer 66, the high dielectric layer 70, and the nonmagnetic electrode 72 of the spin element 4 shown in FIG. 8, respectively. The nonmagnetic electrode 120 serves as a gate electrode using the semiconductor layer 110 as a channel region. Furthermore, the high dielectric layer 118 serves as a gate insulating layer. Therefore, the gate electrode 120 at least covers the side portions of the semiconductor layer 110 and the ferromagnetic layer 114.

In the transistor 100 thus constituted, the magnetization direction of the ferromagnetic layer 114 can be switched by the aforementioned voltage-controlled writing method performed on the spin element 4. If the magnetization direction of the ferromagnetic layer 114 is parallel to (in the same direction as) the magnetization direction of the ferromagnetic layer 106, the resistance of an electric path between the lower electrode 102 and the upper electrode 124 through the channel region (semiconductor layer 110) of the transistor 100 becomes low when a voltage is applied to the gate electrode 120. On the contrary, if the magnetization direction of the ferromagnetic layer 114 is antiparallel to (opposite to) the magnetization direction of the ferromagnetic layer 106, the resistance of the electric path between the lower electrode 102 and the upper electrode 124 through the channel region 110 of the transistor 100 becomes high when a voltage is applied to the gate electrode 120. In this case, the voltage applied in the voltage-controlled writing is preferably higher than the gate voltage needed to turn on the channel region 110. If the circuit is configured such that one of the lower electrode 102 and the upper electrode 124 is electrically open or the lower electrode 102 and the upper electrode 124 have the same potential, a write operation can be performed without causing a current to flow.

Figure 14:
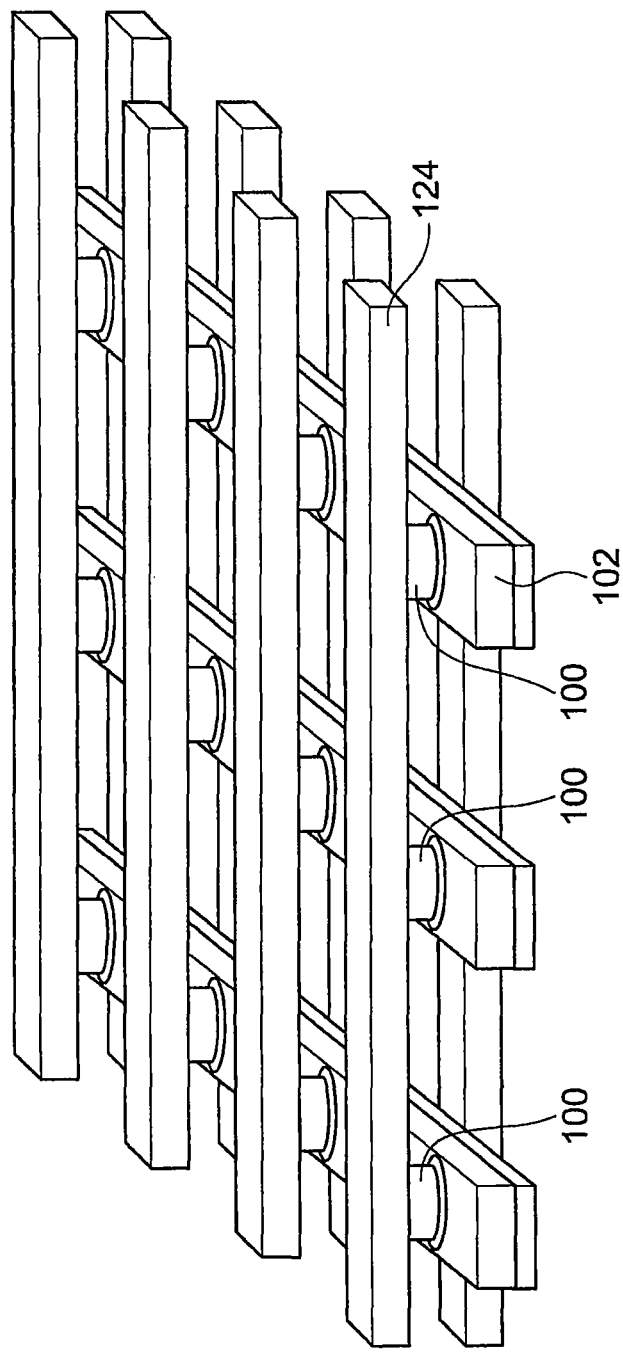
FIG. 14 is a perspective view showing a magnetic memory using a longitudinal spin MOS transistor as a storage element.

If a plurality of longitudinal voltage-controlled writing spin-based MOS field effect transistors 100 are arranged in an array as storage elements as shown in FIG. 14, a cross-point magnetic memory in which the lower electrodes 102 and the upper electrodes 124 are formed as wirings that cross each other. In this case, for example, the upper electrodes 124 extend in a row direction, the lower electrodes 102 extend in a column direction, each upper electrode 124 in a row becomes a common upper electrode, and each lower electrode 102 in a column becomes a common lower electrode. Such a cross-point magnetic memory enables miniaturization and reduction in area.

(Method of Manufacturing Longitudinal Spin-Based MOS Field Effect Transistor)

Next, a method of manufacturing a longitudinal spin-based MOS field effect transistor 100 will be described with reference to FIG. 15. First, a base layer 104, a ferromagnetic layer 106, a tunnel insulating film 108, a semiconductor layer 110, a tunnel insulating film 112, a ferromagnetic layer 114, and a cap layer 116 are sequentially formed in this order on a lower electrode 102.

Then, a resist is applied, and a resist pattern (not shown) is formed using a photolithographic technique. The cap layer 116, the ferromagnetic layer 114, the tunnel insulating film 112, the semiconductor layer 110, the tunnel insulating film 108, the ferromagnetic layer 106, and the base layer 104 are patterned using the resist pattern as a mask, thereby forming a multilayer structure including the base layer 104, the ferromagnetic layer 106, the tunnel insulating film 108, the semiconductor layer 110, the tunnel insulating film 112, the ferromagnetic layer 114, and the cap layer 116. The patterning is performed by a reactive ion etching or milling method.

Next, a high dielectric layer 118 and a nonmagnetic metal layer 120 are sequentially formed, and the resist pattern is removed by a lift-off method.

Figure 15:
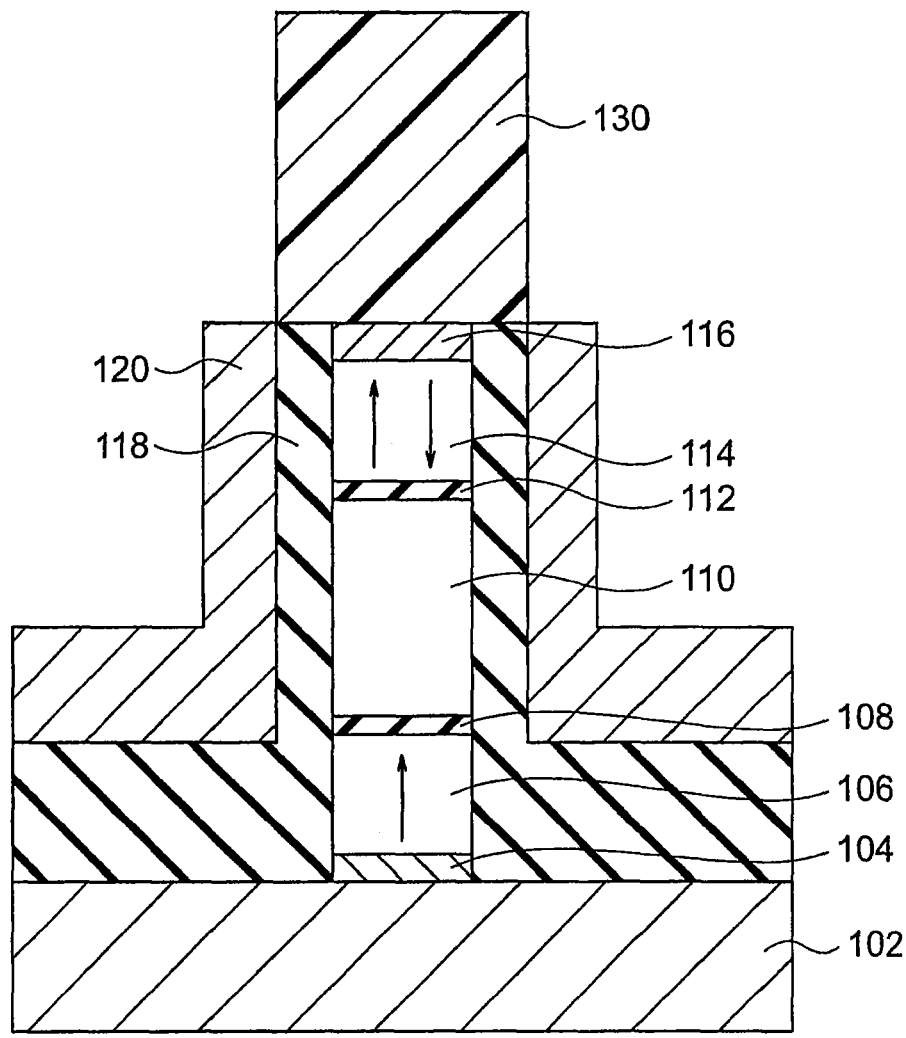
FIG. 15 is a cross-sectional view showing a method of manufacturing a longitudinal spin MOS transistor.

Thereafter, a resist is applied, and a resist pattern 130 is formed using a photolithographic technique as shown in FIG. 15. Using this resist pattern 130 as a mask, the high dielectric layer 118 and the nonmagnetic metal layer 120 except for the portions on the sidewall are removed by a reactive ion etching or milling method. Then, the resist pattern 130 is removed. Finally, a contact 122 and an upper electrode 124 are formed above the cap layer 116 (FIG. 13).

(Seventh Embodiment)

A lateral spin MOS transistor according to the seventh embodiment will be described with reference to FIG. 22. The spin MOS transistor 200 according to the seventh embodiment includes a region 220 and another region 230 that correspond to a source region and a drain region of n-type separately disposed in a p-type semiconductor layer 210. The impurity concentration $n^{+'}$ of the region 220 is lower than the impurity concentration $n^{+}$ of the region 230. For example, the impurity concentration $n^{+'}$ of the region 220 is $1.0 \times 10^{18}$ or more and $1.0 \times 10^{20}$ or less while the impurity concentration $n^{+}$ of the region 230 is $1.0 \times 10^{20}$ or more and $1.0 \times 10^{21}$ or less.

The spin MOS transistor 200 includes a multilayer structure on the region 220, the multilayer structure including a nonmagnetic layer 222 of MgO, for example, and a ferromagnetic layer 224 disposed on the nonmagnetic layer 222. The spin MOS transistor 200 also includes another multilayer structure on the region 230, the multilayer structure including a nonmagnetic layer 232 of MgO, for example, and a ferromagnetic layer 234 disposed on the nonmagnetic layer 232. A gate insulating film 240 is formed on a region to serve as a channel of the semiconductor layer 210 between the region 220 and the region 230, and a gate electrode 250 is formed on the gate insulating film 240. Thus, unlike common MOSFETs, the spin MOS transistor 200 of the seventh embodiment includes a multilayer structure including a nonmagnetic layer and a ferromagnetic layer on each of the source region and the drain region, and the impurity concentration $n^{+'}$ of the region 220, which is one of the source region and the drain region, is set to be lower than the impurity concentration ($1.0 \times 10^{21}$ or less) of the source and the drain regions of a common MOSFET. The impurity concentration $n^{+'}$ of the region 220 can be $1.0 \times 10^{18}$ or more.

Figure 22:
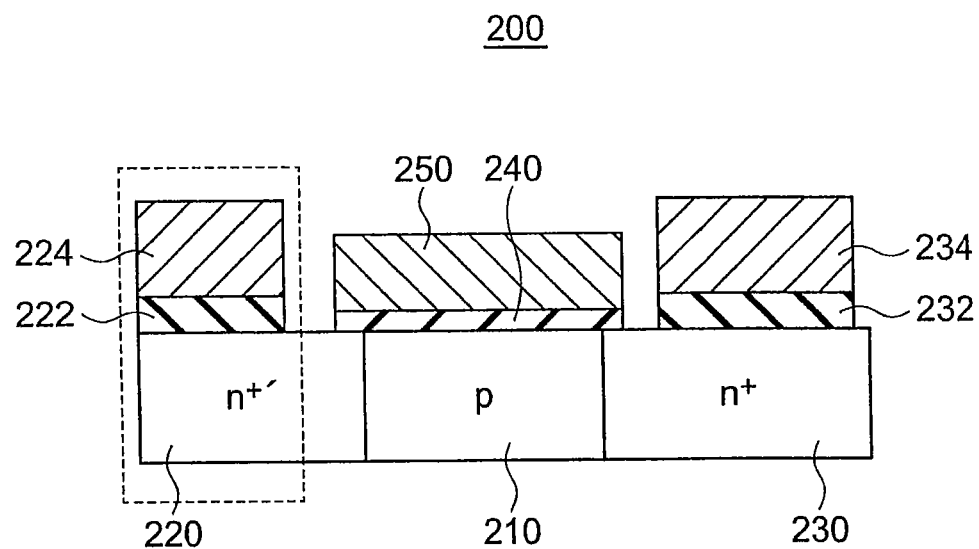
FIG. 22 is a cross-sectional view showing a lateral MOS transistor according to the seventh embodiment.

The multilayer structure including the region 220, the nonmagnetic layer 222, and the ferromagnetic layer 224 of the spin MOS transistor according to the seventh embodiment enclosed in the broken line in FIG. 22 corresponds to the multilayer structure including the nonmagnetic layer 10, the insulating film 11, and the ferromagnetic layer 12 of the memory cell according to the third embodiment. A write operation is performed on the ferromagnetic layer 224 of the multilayer structure including the region 220, the nonmagnetic layer 222, and the ferromagnetic layer 224. Thus, the ferromagnetic layer 224 serves as a free layer in which the direction of magnetization can be switched, and the ferromagnetic layer 234 serves as a fixed layer in which the direction of magnetization is fixed.

In the write operation, a voltage is applied to the gate electrode 250 so that a current flows through the channel, and a voltage is applied between the source region and the drain region to perform magnetization switching writing. When a write operation is performed on the ferromagnetic layer 224, for example, the voltage applied to the ferromagnetic layer 224 is set to be lower than the voltage applied to the ferromagnetic layer 234. In the seventh embodiment, a Schottky barrier is formed between the region 220 and the ferromagnetic layer 224, and the impurity concentration of the region 220 is lower than that of the region 230. Accordingly, if the voltage applied to the ferromagnetic layer 224 is lower than the voltage applied to the ferromagnetic layer 234, substantially no current flows through the channel, and the spin transfer writing is not performed. Instead, the voltage-controlled writing described in the first embodiment or the third embodiment is performed. A read operation is performed by applying a voltage to the gate electrode 250 to cause a current to flow through the channel, and then setting the voltage applied to the ferromagnetic layer 224 to be higher than the voltage applied to the ferromagnetic layer 234.

Although the spin MOS transistor shown in FIG. 22 is an n-channel spin-based MOSFET, a p-channel spin-based MOSFET may also be used. In such a case, the region 220 of $n^{+'}$ type, the p-type semiconductor layer 210, and the region 230 of $n^{+}$ type become a region of $p^{+'}$ type, an n-type semiconductor layer, and a region of $p^{+}$ type, respectively.

The nonmagnetic layers 222, 232 can be eliminated in the seventh embodiment. In such a case, the multilayer structure including the region 220 and the ferromagnetic layer 224 corresponds to the multilayer structure including the nonmagnetic layer 10 and the ferromagnetic layer 12 of the memory cell according to the first embodiment. With such a multilayer structure, a write operation can be performed on the ferromagnetic layer 224 in the same manner as described in the first embodiment.

If a p-channel spin MOS transistor is used, the voltage magnitude relationship is opposite to that of an n-channel spin MOS transistor.

Hereinafter, the embodiments will be described in more detail with reference to several examples.

EXAMPLE 1

Figure 16:
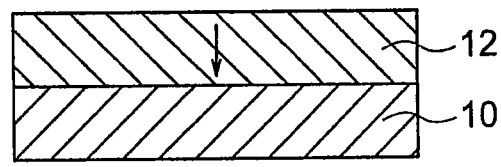
FIG. 16 is a cross-sectional view showing an element according to Example 1.
Figure 17:
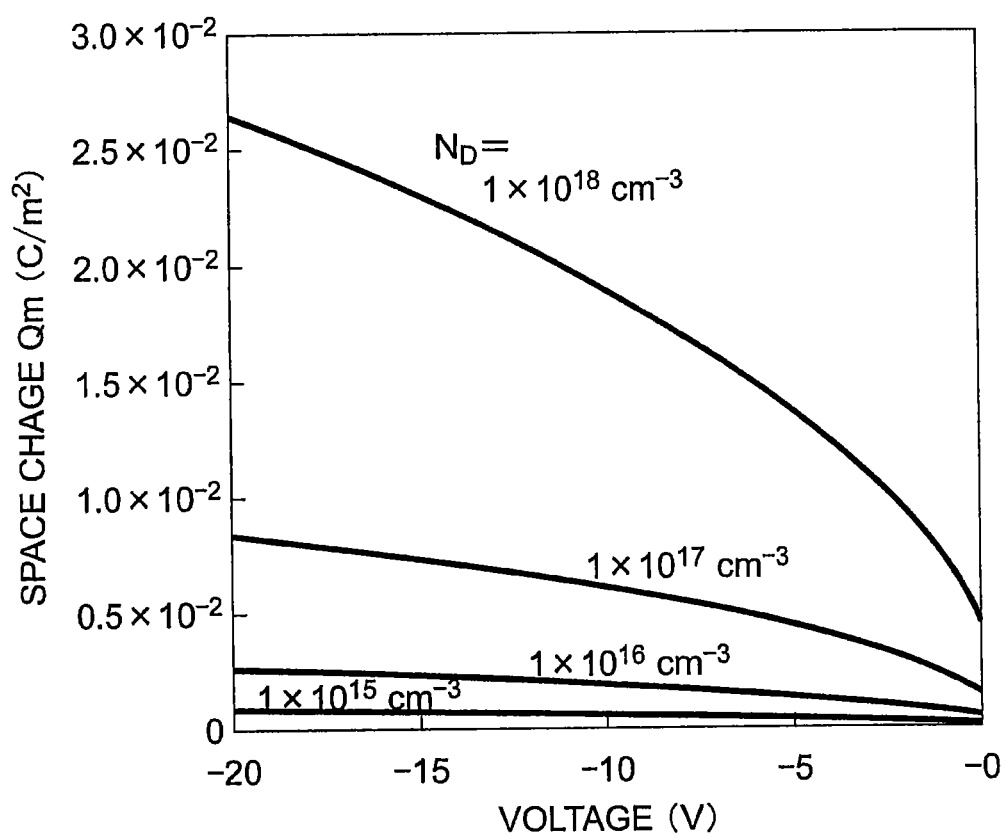
FIG. 17 is a diagram showing characteristics of the element according to Example 1.

FIG. 16 shows an element according to Example 1. The element of Example 1 has a multilayer structure including a nonmagnetic layer 10 and a ferromagnetic layer 12. The nonmagnetic layer 10 of Example 1 is formed of n-type silicon (Si). When a voltage applied to the nonmagnetic layer 10 set to be 0 V, and a negative voltage is applied to the ferromagnetic layer 12, a depletion layer is formed at the interface between the ferromagnetic layer 12 and the nonmagnetic layer 10. The amount of space charge $Q_m$ in the depletion layer can be obtained by the following expression using the step junction approximation:

$$Q_m = -\sqrt{2qN_D \in_s (V_{bi} - V)}$$

where q denotes elementary charge, $N_D$ denotes donor density, $\in_s$ denotes Si dielectric constant, $V_{bi}$ denotes built-in potential, and V denotes applied voltage. FIG. 17 shows a simplified case where the built-in potential of the multilayer structure is 0 V, and the variations of the space charge $Q_m$ when V changes are plotted. The lines in FIG. 17 represent the cases where the donor density $N_D$ is $1 \times 10^{18}$ cm$^{-3}$, $1 \times 10^{17}$ cm$^{-3}$, $1 \times 10^{16}$ cm$^{-3}$, and $1 \times 10^{15}$ cm$^{-3}$.

The amount of induced charge at the surface of the ferromagnetic layer 12 in contact with the nonmagnetic layer 10 is $-Q_m$. Accordingly, as the voltage increases, the amount of induced charge increases. Specifically, as the applied voltage V increases, the number of electrons at the surface of the ferromagnetic layer 12 changes, leading to a change in the magnetic anisotropy of the ferromagnetic layer 12.

Next, a method of switching the magnetization using the above principle will be described. If the voltage applied to the nonmagnetic layer 10 is set to be 0 V, and a negative pulse voltage is applied to the ferromagnetic layer 12, the direction of magnetization is switched as the magnetic anisotropy changes in accordance with the aforementioned principle. Then, the magnetization precession starts. When the application of the pulse voltage ends, the precession also ends. Accordingly, the magnetization can be set in the direction opposite to the original direction by appropriately selecting the pulse width.

If a negative voltage is applied to the ferromagnetic layer 12, a depletion layer is formed between the ferromagnetic layer 12 and the nonmagnetic layer 10, and no current flows. However, if a positive voltage is applied, a current flows. Therefore, if the nonmagnetic layer 14 and the ferromagnetic layer 16 are formed on the ferromagnetic layer 12 as shown in FIG. 1A to constitute a magnetic tunnel junction (MTJ) including the ferromagnetic layer 12, the nonmagnetic layer 14, and the ferromagnetic layer 16, a current can be caused to flow to read a resistance value. Accordingly, such a structure may be used as a memory cell.

EXAMPLE 2

Figure 18:
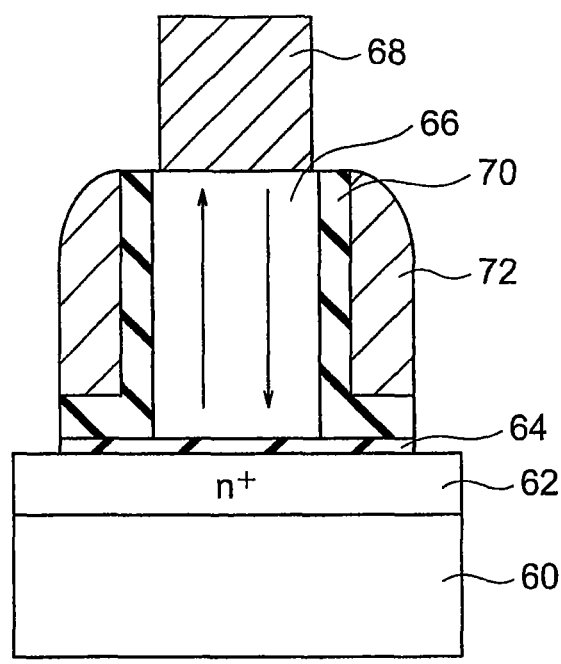
FIG. 18 is a cross-sectional view showing a spin element according to Example 2.

FIG. 18 shows a voltage-controlled writing spin element (hereinafter also referred to as the "spin element") according to Example 2. The spin element according to Example 2 has the same structure as the spin element 4 shown in FIG. 8. The spin element 4 of Example 2 is formed in the following manner. First, an n$^+$ semiconductor region 62 is formed in a p-type Si(001) layer 60. Thereafter, a tunnel insulating film 64 and a ferromagnetic layer 66 of CoFe having a thickness of 1 nm are sequentially formed on the n$^+$ semiconductor region 62, and the ferromagnetic layer 66 and the tunnel insulating film 64 are patterned. Subsequently, a ferroelectric layer 70 of TiO$_2$ having a thickness of 10 nm is formed on a side portion of the ferromagnetic layer 66. Then, an electrode 68 having a multilayer structure including a Ti layer having a thickness of 50 nm and a Au layer having a thickness of 150 nm is formed on the ferromagnetic layer 66, and a nonmagnetic electrode 72 is formed on the ferroelectric layer 70, respectively.

Figure 19:
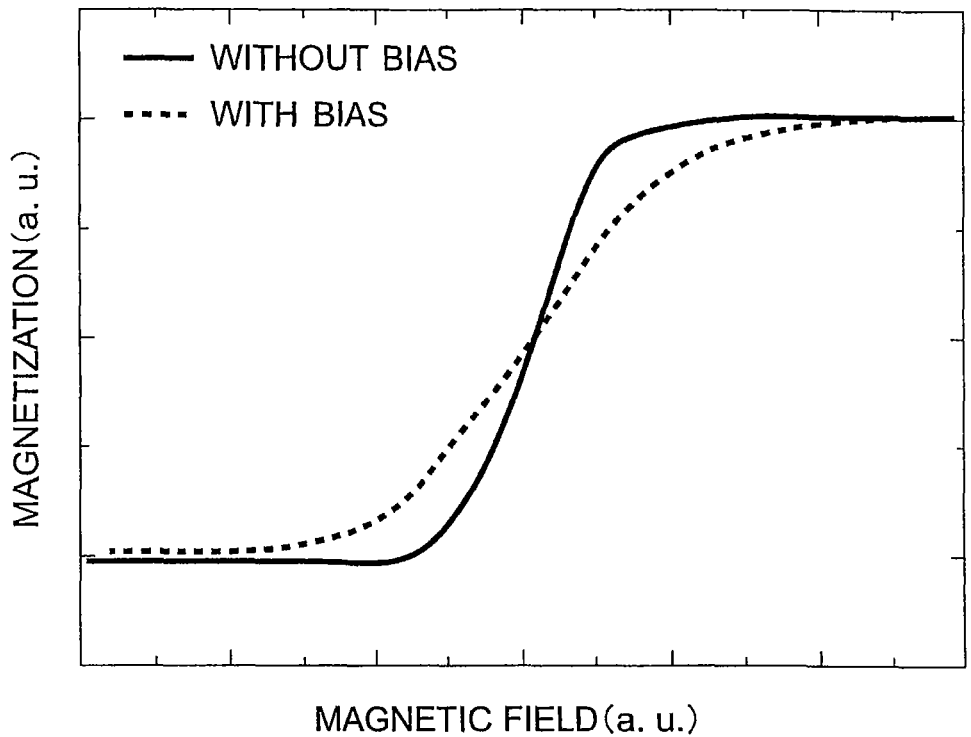
FIG. 19 is a diagram showing characteristics of the spin element according to Example 2.

FIG. 19 shows magnetization characteristics of a case where a bias voltage is applied between the semiconductor region 62 and the electrode 68 in Example 2. As can be understood from FIG. 19, the coercive force differs deepening on whether a bias voltage is applied or not. Thus, it can be understood that the magnetization of the ferromagnetic layer 66 in Example 2 can be switched by a voltage.

The high dielectric layer is preferably formed of titanium oxide that has a high relative dielectric constant, or an insulating material containing an oxide formed of titanium oxide and at least one element selected from the group consisting of Group 2, Group 3, Group 4, and Group 5 elements and lanthanide elements. FIG. 9 shows examples of such insulating materials.

EXAMPLE 3

Figure 20:
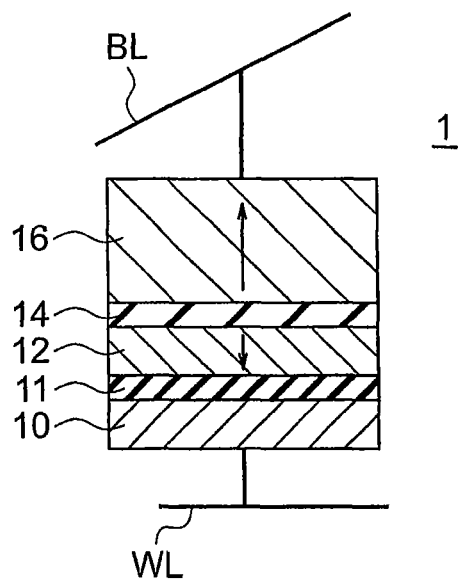
FIG. 20 is a diagram showing a magnetic memory according to Example 3.

FIG. 20 shows a magnetic memory according to Example 3. The magnetic memory according to Example 3 is the magnetic memory shown in FIG. 4, in which each memory cell 1 has the semiconductor layer 10 of Si, and the insulating film 11 of MgO, for example. The ferromagnetic layer 12 has a double-layer structure including a layer of ferrite containing Co—Fe—O or ferrite containing γ-Fe$_2$O$_3$, and a layer of a ferromagnetic material having a body-centered cubic (BCC) structure (for example, CoFe). In this case, the layer of ferrite is located on the side of the semiconductor layer 10, and the layer of ferromagnetic material is located on the side of the tunnel insulating film 14. The tunnel insulating film 14 is formed of, for example, MgO. The ferromagnetic layer 16 is formed of a ferromagnetic material having a body-centered cubic (BCC) structure (for example, CoFe). The insulating film 11 may not be disposed since it is just for adjusting the tunnel barrier resistance.

In Example 3, the layer of ferrite is on the side of the semiconductor layer 10. Accordingly, the magnetization direction of the ferromagnetic layer 12 can be easily switched by a voltage. An MR ratio of an MTJ element including the ferromagnetic layer 12, the tunnel insulating film 14, and the ferromagnetic layer 16 can also be used.

If the memory cell 1 of Example 3 is used for a cross-point memory, the tunnel insulating film 14 can be thick. If the tunnel insulating film 14 of MgO is made thicker, the MR ratio of the MTJ element can be increased up to about 800%. This can be applied to a multi-valued memory by setting a metastable axis of spin to be perpendicular or parallel to the film plane of the ferromagnetic layer 12.

The following materials can be used for the aforementioned embodiments and examples.

The semiconductor layer 10 can be formed of n-type or p-type silicon, Ge, or Si$_x$Ge$_{1-x}$ (0<x<1). A III-V, II-VI, or II-VI compound semiconductor, or magnetic semiconductor can also be used. A semiconductor disposed on an insulating material (such as SOI, GOI, SiGe On I, III-V On I, II-VI On I) can also be used.

Each of the ferromagnetic layers 12, 16, 20, 30, 54, 66, 87 preferably has one-directional anisotropy, and has a thickness of 0.1 to 100 nm. Since the ferromagnetic layers should have a thickness so as not to become superparamagnetic, the thickness is more preferably 0.4 nm or more. The ferromagnetic layers may be formed of a Heusler alloy, such as Co$_2$FeAl$_{1-x}$Si$_x$ and Co$_2$Mn$_{1-x}$Fe$_x$Si.

Furthermore, Co, Fe, Ni, and an alloy thereof such as Co—Pt, Co—Fe—Pt, Fe—Pt, Co—Fe—Cr—Pt, Co—Cr—Pt, Co—Pd, NiMnSb, Co$_2$MnGe, Co$_2$MnAl, Co$_2$MnSi, CoCrFeAl, Zn—Fe—O, Fe—O can also be used to form the ferromagnetic layers.

Furthermore, a magnetic semiconductor selected from the group consisting of GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, and SiGeMn can also be used.

Moreover, a ferrite having a composition X—Fe—O (where X is one of Mn, Co, Ni, Cu, Zn, Ba, Sr, Pb and rare earth elements).

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), and niobium (Nb) can be added to the aforementioned magnetic material to adjust the magnetic characteristics and the other characteristics such as crystallinity, mechanical characteristics, and chemical characteristics.

Figure 21:
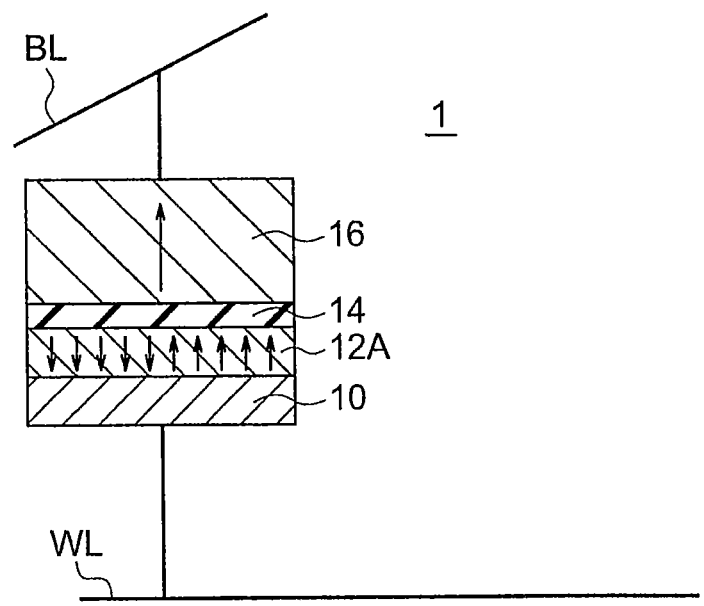
FIG. 21 is a diagram showing a magnetic memory according to Example 4.

The magnetic memory 1 may have a structure in accordance with Example 4 shown in FIG. 21. The magnetic memory of Example 4 is obtained by replacing the ferromagnetic layer 12 of the magnetic memory of the first embodiment shown in FIG. 1A with a magnetic layer 12A that records magnetization. The magnetic layer 12A is formed of a material and has a structure with which a domain wall can be easily formed. This may be applied to a method to have multi-valued data in each cell. In such a case, a so-called "verification writing," in which magnetization switching writing and reading are alternately performed, and whether a desired data is written or not is verified.

The tunnel insulating film may be formed of an oxide or nitride of Si, Ge, Al, Ga, Mg, and Ti, SrTiO, and NdGaO.

The nonmagnetic layers 24, 72, 120 may be formed of at least one element selected from the group consisting of Cu, Ru, Cr, Au, Ag, Hf, Zr, Rh, Pt, Ir, Al, La, Mg, an alloy or oxide of such an element, an oxide or nitride of Si, Ge, Al, Ga, Mg, and Ti, SrTiO, NdGaO, $Si_xGe_{1-x}$ (0<x<1), a III-V or II-VI compound semiconductor, or a magnetic semiconductor. The nonmagnetic layers 24, 72, 120 may also be formed of an oxide or nitride of Si, Ge, Al, Ga, Mg, and Ti, SrTiO, and NdGaO.

A spin transistor, memory, or integrated circuit may be formed using a structure of the aforementioned embodiments and examples. A memory including a memory cell including a spin memory or a spin transistor of the aforementioned embodiments and examples, a field effect transistor, and other storage elements may also be formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a multilayer structure including in order a semiconductor layer, a first ferromagnetic layer, a nonmagnetic layer, and a second ferromagnetic layer, the first ferromagnetic layer being in contact with the semiconductor layer, the semiconductor layer and the first ferromagnetic layer forming a Schottky barrier in between;
a first wiring line electrically connected to the semiconductor layer;
a second wiring line electrically connected to the second ferromagnetic layer; and
a voltage applying circuit electrically connected between the first wiring line and the second wiring line to apply a first voltage between the semiconductor layer and the second ferromagnetic layer during a write operation,
a magnetization direction of the first ferromagnetic layer being switchable by applying the first voltage.

2. A memory according to claim 1 wherein the first ferromagnetic layer is formed of any of an oxide magnetic material, a Mn-based magnetic material, and a Heusler-based magnetic material.

3. A magnetic memory comprising:
a multilayer structure including in order a semiconductor layer, a first ferromagnetic layer, a nonmagnetic layer, and a second ferromagnetic layer, and including a first insulating film disposed between the semiconductor layer and the first ferromagnetic layer, the first insulating film being in contact with the semiconductor layer and being in contact with the first ferromagnetic layer;
a first wiring line electrically connected to the semiconductor layer;
a second wiring line electrically connected to the second ferromagnetic layer; and
a voltage applying circuit electrically connected between the first wiring line and the second wiring line to apply a first voltage between the semiconductor layer and the second ferromagnetic layer during a write operation,
a magnetization direction of the first ferromagnetic layer being switchable by applying the first voltage.

4. A memory according to claim 1, wherein the voltage applying circuit applies a second voltage between the first wiring line and the second wiring line via the multilayer structure during a read operation, to cause a read current to flow through the multilayer structure.

5. A memory according to claim 4, wherein a polarity of the first voltage is opposite to a polarity of the second voltage.

6. A memory according to claim 1, wherein the multilayer structure is disposed between the first wiring line and the second wiring line.

7. A magnetic memory comprising:
a multilayer structure including a nonmagnetic conductive layer, a first ferromagnetic layer, a nonmagnetic insulating layer disposed between the nonmagnetic conductive layer and the first ferromagnetic layer, a nonmagnetic layer disposed on the first ferromagnetic layer on a side opposite to the nonmagnetic insulating layer, and a second ferromagnetic layer disposed on the nonmagnetic layer on a side opposite to the first ferromagnetic layer, the nonmagnetic conductive layer and the nonmagnetic insulating layer opposed to each other without having a magnetic material disposed therebetween;
a first wiring line electrically connected to the nonmagnetic conductive layer;
a second wiring line electrically connected to the second ferromagnetic layer; and
a voltage applying circuit electrically connected between the first wiring line and the second wiring line to apply a first voltage between the nonmagnetic conductive layer and the second ferromagnetic layer,
a magnetization direction of the first ferromagnetic layer being switchable by applying the first voltage.

8. A memory according to claim 7, wherein the voltage applying circuit applies a second voltage between the first wiring line and the second wiring line via the multilayer structure during a read operation, to cause a read current to flow through the multilayer structure.

9. A memory according to claim 8 wherein a polarity of the first voltage is opposite to a polarity of the second voltage.

10. A magnetic memory comprising:
a magnetic structure including in order, a nonmagnetic metal layer, an insulating film which is in contact with the nonmagnetic metal layer, and a first ferromagnetic layer disposed in contact with the insulating film on a side opposite to the nonmagnetic metal layer;
a first wiring line electrically connected to the nonmagnetic metal layer;
a second wiring line electrically connected to the first ferromagnetic layer; and
a voltage applying circuit electrically connected between the first wiring line and the second wiring line to apply a first voltage between the nonmagnetic metal layer and the first ferromagnetic layer during a write operation, and to apply a second voltage between the nonmagnetic metal layer and the first ferromagnetic layer during a read operation, a polarity of the first voltage being opposite to a polarity of the second voltage, a magnetization direction of the first ferromagnetic layer being switchable by applying the reverse-bias first voltage.

11. A memory according to claim 3 wherein the first ferromagnetic layer is formed of any of an oxide magnetic material, a Mn-based magnetic material, and a Heusler-based magnetic material.

12. A memory according to claim 3, wherein the voltage applying circuit applies a second voltage between the first wiring line and the second wiring line via the multilayer structure during a read operation, to cause a read current to flow through the multilayer structure.

13. A memory according to claim 12, wherein a polarity of the first voltage is opposite to a polarity of the second voltage.

14. A memory according to claim 3, wherein the multilayer structure is disposed between the first wiring line and the second wiring line.

15. A memory according to claim 10, further comprising a nonmagnetic layer disposed on the first ferromagnetic layer on a side opposite to the insulating film, the nonmagnetic layer being electrically connected to the second wiring line.

16. A memory according to claim 15, further comprising a second ferromagnetic layer disposed on the nonmagnetic layer on a side opposite to the first ferromagnetic layer, the second ferromagnetic layer being electrically connected to the second wiring line.

17. A magnetic memory comprising:
a multilayer structure including in order a semiconductor layer, and a first ferromagnetic layer, the first ferromagnetic layer being in contact with the semiconductor layer, the semiconductor layer and the first ferromagnetic layer forming a Schottky barrier in between;
a first wiring line electrically connected to the semiconductor layer;
a second wiring line electrically connected to the first ferromagnetic layer; and
a voltage applying circuit electrically connected between the first wiring line and the second wiring line to apply a first voltage between the semiconductor layer and the first ferromagnetic layer during a write operation,
a magnetization direction of the first ferromagnetic layer being switchable by applying the first voltage.

18. A memory according to claim 17 wherein the first ferromagnetic layer is formed of any of an oxide magnetic material, a Mn-based magnetic material, and a Heusler-based magnetic material.

19. A memory according to claim 17, wherein the voltage applying circuit applies a second voltage between the first wiring line and the second wiring line via the multilayer structure during a read operation, to cause a read current to flow through the multilayer structure, and a polarity of the first voltage is opposite to a polarity of the second voltage.

20. A memory according to claim 1, wherein the voltage applying circuit applies a second voltage between the first wiring line and the second wiring line via the multilayer structure during a read operation, to cause a read current to flow through the multilayer structure, and a polarity of the first voltage is opposite to a polarity of the second voltage.

* * * * *